United States Patent
Kato et al.

(10) Patent No.: US 7,023,291 B2
(45) Date of Patent: Apr. 4, 2006

(54) OVEN CONTROLLED CRYSTAL OSCILLATOR FOR HIGH STABILITY

(75) Inventors: Hiroshi Kato, Saitama (JP); Manabu Ito, Saitama (JP); Takeshi Uchida, Saitama (JP)

(73) Assignee: Nihon Dempa Kogyo Co., Ltd., Saitama (JP)

( * ) Notice: Subject to any disclaimer, the term of this patent is extended or adjusted under 35 U.S.C. 154(b) by 27 days.

(21) Appl. No.: 10/946,890

(22) Filed: Sep. 22, 2004

(65) Prior Publication Data

US 2005/0082377 A1   Apr. 21, 2005

(30) Foreign Application Priority Data

Sep. 24, 2003 (JP) ............................. 2003-332336
May 7, 2004 (JP) ............................. 2004-139175

(51) Int. Cl.
  *H03B 5/32* (2006.01)
(52) U.S. Cl. .................... 331/158; 331/69; 331/68; 331/66; 331/176
(58) Field of Classification Search ............ 331/66, 331/68, 69, 158, 176; 310/343
See application file for complete search history.

(56) References Cited

U.S. PATENT DOCUMENTS

| | | | | |
|---|---|---|---|---|
| 5,041,800 A | * | 8/1991 | Long et al. | 331/69 |
| 6,049,256 A | * | 4/2000 | Fry | 331/69 |
| 6,060,692 A | * | 5/2000 | Bartley et al. | 219/210 |
| 6,147,565 A | * | 11/2000 | Satoh et al. | 331/70 |
| 2005/0258913 A1 | * | 11/2005 | Ito et al. | 331/158 |

* cited by examiner

*Primary Examiner*—Arnold Kinkead
(74) *Attorney, Agent, or Firm*—Scott D. Wofsy; Edwards Angell Palmer & Dodge LLP

(57) ABSTRACT

To provide a highly stable crystal oscillator having increased thermal efficiency. The highly stable crystal oscillator comprises; a thermostat mainframe which maintains the temperature of a crystal resonator including a resonator container for sealing a crystal piece constant, an oscillating element which constitutes an oscillation circuit together with said crystal resonator, a temperature control element which controls the temperature inside of said thermostat mainframe, and a circuit board mounted with said thermostat mainframe, said oscillating element, and said temperature control element. The construction is such that a heat generating chip resistor and a highly heat sensitive element having a higher temperature dependency, among said oscillating element and said temperature control element, are arranged on one principal plane of said circuit board, and said heat generating chip resistor, said highly heat sensitive element, and said thermostat mainframe are directly heat bonded by a thermo-conductive material.

14 Claims, 4 Drawing Sheets

OVEN CONTROLLED CRYSTAL OSCILLATOR FOR HIGH STABILITY

BACKGROUND OF THE INVENTION

1. Field of the Invention

The present invention relates to an oven controlled crystal oscillator for high stability, using a thermostat (hereunder, "highly stable oscillator"), and particularly relates to a highly stable oscillator which is effective in heat utilization.

2. Description of the Related Art

In this kind of crystal oscillator, the operating temperature of the crystal resonator is maintained constant by an oven controlled using a thermostat so as to increase the frequency stability. For example, it has been used for base stations for optical communication. Recently, miniaturization has spread even to industrial crystal oscillators, requiring corresponding miniaturization.

FIG. 7 is diagrams for explaining an example of a conventional crystal oscillator, FIG. 7A being a fragmentary vertical sectional view of a highly stable oscillator, and FIG. 7B being a conceptual diagram showing a procedure for inserting a crystal resonator into a thermostat.

As shown in FIG. 7A, this highly stable oscillator comprises a crystal resonator 2, an oven controlled by a thermostat (hereunder, "thermostat") 3 which accommodates the crystal resonator 2, and oscillating elements 4 and temperature control elements 5, which are all mounted on a first circuit board 1a and a second circuit board 1b. The first circuit board 1a is supported by metallic pins 7a serving as external terminals which are insulated from and pierce a metallic base 6. The second circuit board 1b is supported by metallic pins 7b placed on the first circuit board 1a. In addition, thermostat 3 is supported by a leg 7c with the second circuit board 1b.

As shown in FIG. 7B, the crystal resonator 2 is sealed in a resonator container 9 composed of a metallic case out of which is led a pair of lead wires 8 for, for example, an AT cut or an SC cut crystal piece. The thermostat 3 comprises a heating coil 11 coiled around the periphery of a thermostat mainframe (metallic cylinder) 10 which accommodates the crystal resonator 2 therein. Alternatively, the heating coil 11 may be coiled directly around the resonator container 9 of the crystal resonator 2. The thermostat 3 is arranged in the center of one principal plane of the second circuit board 1b and adhered to the second circuit board 1b by an adhesive 12.

Particularly in the case where the crystal resonator 2 is vacuum sealed, the temperature of the crystal piece is determined by the radiant heat from the resonator container 9. Therefore the heat capacity is reduced compared to the case where a gas is additionally sealed in. On the other hand, if the thermostat mainframe 10 is used, the heat capacity is increased by the thermostat mainframe 10 itself. Therefore there is no oversensitive response with respect to rapid temperature variations, enabling prevention of momentary fluctuations in the oscillating frequency, and an increase in the stability. However, the starting characteristics of the crystal resonator are reduced. Moreover, in the case where the heating coil is coiled directly around the resonator container 9, then for example if the subsequently sealed crystal resonator 2 has some defect, the heating coil 11 and the like must also be discarded. However, if the thermostat mainframe 10 is used, only the defective crystal resonator 2 need be exchanged, which is economically convenient.

The oscillating elements 4 constitute an oscillation circuit together with the crystal resonator 2, and are arranged on the other principal plane of the second circuit board 1b. The temperature control elements 5 also contain at least a thermistor 5a as the temperature sensitive element, and together with a transistor constitutes a temperature control circuit which controls the temperature of the thermostat 3. The members except for the thermistor 5a are arranged on the outside surface of the first circuit board 1a. The temperature control circuit detects the temperature inside the thermostat 3 by joining the thermistor 5a to the thermostat 3 for example. Then, based on the detected temperature, the power to be supplied to the heating coil 11 is controlled to maintain the temperature inside the thermostat 3 constant. The first and the second circuit boards 1a and 1b, the crystal resonator 2 and the like are covered with a metallic cover 17.

According to such a construction, the operating temperature of the crystal resonator 2 can be kept constant by the thermostat 3, enabling prevention of frequency fluctuations of the oscillation frequency due to temperature variations. In other words, fluctuations in the oscillating frequency based on the frequency temperature characteristics of the crystal resonator 2 can be prevented. Moreover, since the second circuit board 1b mounted with the oscillating elements 4 is arranged on the thermostat 3, frequency fluctuations due to the temperature characteristic of the circuit element itself can be prevented.

Therefore, such a crystal oscillator is employed particularly for industrial crystal oscillators where, by increasing the frequency stability, for example the frequency deviation can be made 0.05 ppm or less.

Moreover, in the conventional crystal oscillator as shown in FIG. 7A, the second circuit board 1b is mounted with the oscillating elements 4 and electrically connected to the first circuit board 1a by the metallic pins 7b, and the metallic pins 7a of the first circuit board 1a are led out as the external terminals. Therefore, the metallic pins 7b of the second circuit board 1b are not led out directly to the outside, enabling prevention of heat release to the outside.

However, in the conventional highly stable oscillator having the above construction, the second circuit board 1b is jointed onto the thermostat 3 by the adhesive 12. Accordingly, the heat from the heating coil 11 of the thermostat 3 is blocked by this adhesive 12, so that the thermal efficiency with respect to the oscillating elements 4 on the second circuit board 1b is impaired. The general adhesive 12 is poor in pyroconductivity.

Moreover, even if a thermo-conductive adhesive 12 is applied, it is difficult to control the thickness of the adhesive 12, thus generating an uneven coating, so that the heat distribution of the second circuit board 1b becomes unstable. Furthermore, after the metallic cover 17 is covered over the thermostat 3, convection occurs inside the cover 17, which generates temperature variations in the oscillating elements 4 on the second circuit board 1b. Particularly, together with the thermo-sensor (thermistor 5a), for example a voltage variable capacitative element as the highly temperature dependent highly heat sensitive element is directly affected, so that its characteristics are reduced. Furthermore, the thermostat 3 is manufactured by coiling the heating coil 11 around the thermostat mainframe 10. Hence manufacturing costs are increased.

SUMMARY OF THE INVENTION

An object of the present invention is to provide a highly stable oscillator having increased thermal efficiency.

The present invention, in a crystal oscillator for high stability using a thermostat, comprising; a thermostat mainframe which maintains the temperature of a crystal resonator including a resonator container for sealing a crystal piece constant, an oscillating element which constitutes an oscillation circuit together with said crystal resonator, a temperature control element which controls the temperature inside of said thermostat mainframe, and a circuit board mounted with said thermostat mainframe, said oscillating element, and said temperature control element, has a construction such that a heat generating chip resistor and a highly heat sensitive element having a higher temperature dependency, among said oscillating element and said temperature control element, are arranged on one principal plane of said circuit board, and said heat generating chip resistor, said highly heat sensitive element, and said thermostat mainframe are directly heat bonded by a thermo-conductive material.

According to such construction, a thermostat where the chip resistor arranged on the circuit board is directly heat bonded to the thermostat mainframe by the thermo-conductive flexible material, is formed. Moreover, since the chip resistor directly supplies heat to the circuit board, the thermal efficiency is improved and the heat distribution of the circuit board is made uniform. Particularly, since the highly heat sensitive element is directly heat bonded to the chip resistor, the highly heat sensitive element has high dependency with respect to the exothermic temperature of the chip resistor. Furthermore, since the chip resistor is used as the heat source, then for example, the coiling operation for the heating coil becomes unnecessary, thus decreasing manufacturing costs.

Moreover, in the highly stable oscillator of the present invention, said thermo-conductive material is a flexible material, and said flexible material is provided between said heat generating chip resistor, said highly heat sensitive element and said thermostat mainframe and adhered thereto. Accordingly, the heat generating chip resistor, the highly heat sensitive element, and the thermostat mainframe are adhered by the flexible material, so that heat bonding is performed directly.

Furthermore, in the highly stable oscillator of the present invention, said flexible material is in sheet form and is provided between said heat generating chip resistor, said highly heat sensitive element and said thermostat mainframe. Accordingly, for example if the thickness of the flexible material in sheet form is made larger and is laid between the chip resistor, the highly heat sensitive element and the thermostat mainframe on the circuit board, it can be bit into by the surroundings of the chip resistor and the highly heat sensitive element to give close contact, so that operation of the close contact with the flexible material is improved.

Furthermore, in the highly stable oscillator of the present invention, said thermostat mainframe has a space section in a cross sectional C shape with a pair of legs extending from the opposite ends of a housing section, and said crystal resonator is heat bonded to said thermostat mainframe to be arranged in said space section, and said heat generating chip resistor and said highly heat sensitive element are arranged in said space section. Accordingly, the heat capacity of the thermostat is increased compared to the case of using only the resonator container, and is insensitive with respect to temperature variations, and the momentary fluctuations in the oscillating frequency of the crystal resonator are prevented.

In the highly stable oscillator of the present invention, said thermostat mainframe has a space section in a cross sectional C shape with a pair of legs extending from the opposite ends of a slab part, and said crystal resonator is heat bonded to said thermostat mainframe to be arranged in the upper part of said space section, and said heat generating chip resistor and said highly heat sensitive element are arranged at the lower part of said space section. Accordingly, similarly, the heat capacity of the thermostat is increased, and the space section in the cross sectional C shape may be formed by folding a plate material in the C shape. Hence manufacturing costs can be decreased.

Moreover, in the highly stable oscillator of the present invention, said thermostat mainframe serving as said resonator container, has said heat generating chip resistor and said highly heat sensitive element arranged on the lower face of said resonator container. Accordingly, the thermostat mainframe can be made unnecessary, so that manufacturing costs can be further decreased. In this case, since the temperature response becomes sensitive, the starting characteristics of the crystal resonator become quick. However, stability of the oscillating frequency of the crystal resonator with respect to rapid temperature variations is decreased.

Furthermore, in the high stability oscillator of the present invention, said highly heat sensitive element is a thermo-sensor among the temperature control elements, or a voltage variable capacitative element among the oscillating elements. Accordingly, for example if the highly heat sensitive element is the thermo-sensor, the temperature of the heat generating chip resistor and the thermostat mainframe can be detected in real time, so that the response of the temperature control can be improved. Moreover, if the highly heat sensitive element is the voltage variable capacitative element, the temperature of the thermostat mainframe which depends on the exothermic temperature of the chip resistor becomes constant, so that the decrease in characteristics due to temperature variation is prevented.

In the highly stable oscillator of the present invention, the oscillating element is arranged on the other principal plane of said circuit board. Accordingly, the temperature of the oscillating element is kept constant, and the frequency stability of the crystal resonator is improved.

DETAILED DESCRIPTION OF THE INVENTION

First Embodiment

Figure 1A:
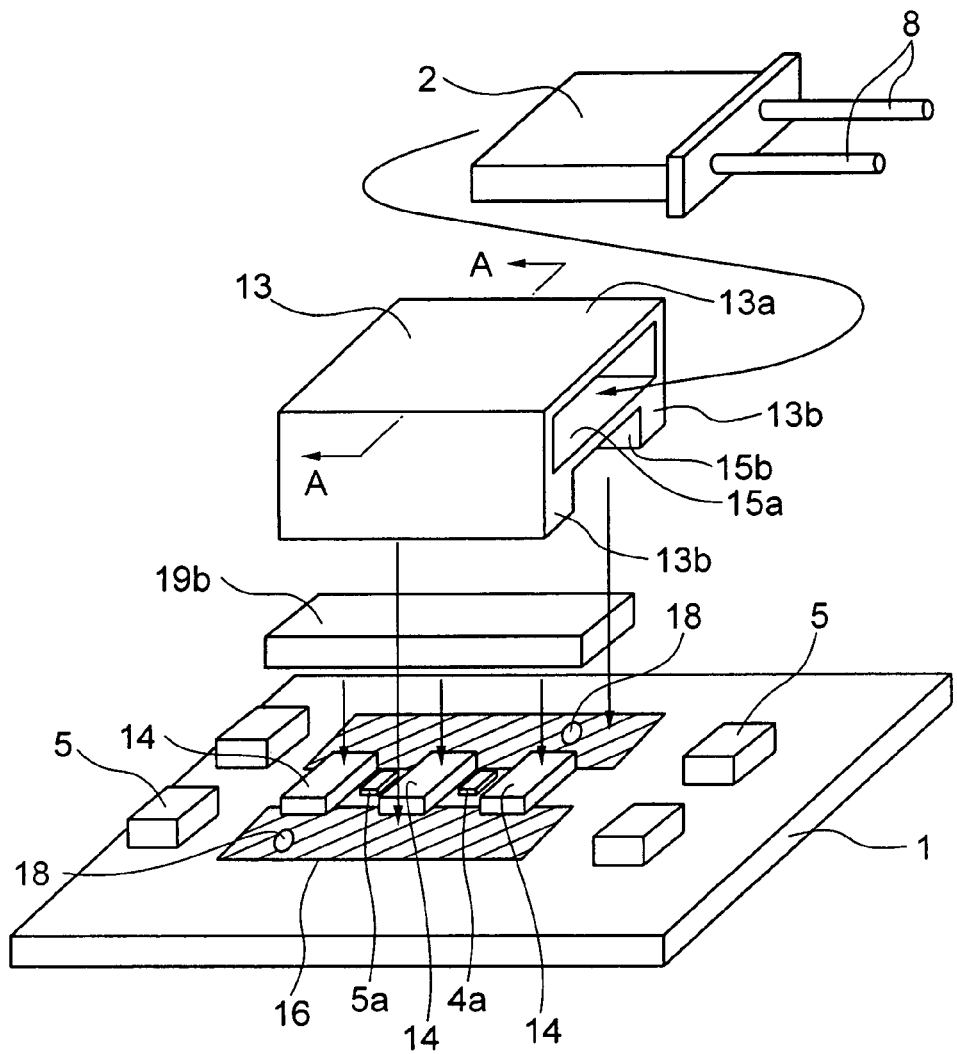
FIG. 1 is diagrams for explaining a first embodiment of a highly stable oscillator of the present invention, FIG. 1A being an assembly exploded view of the main point, and FIG. 1B being a vertical sectional view along the line A—A of FIG. 1A.
Figure 1B:
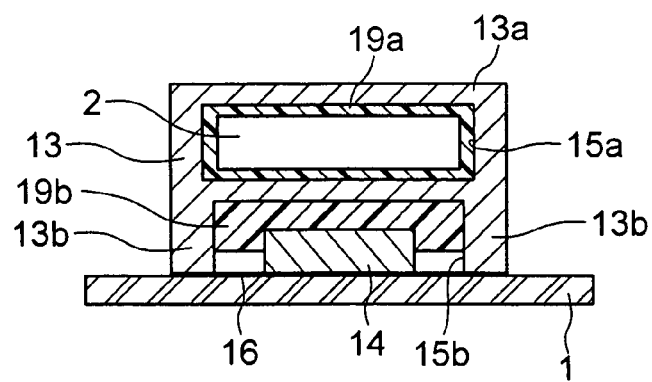
Figure 2:
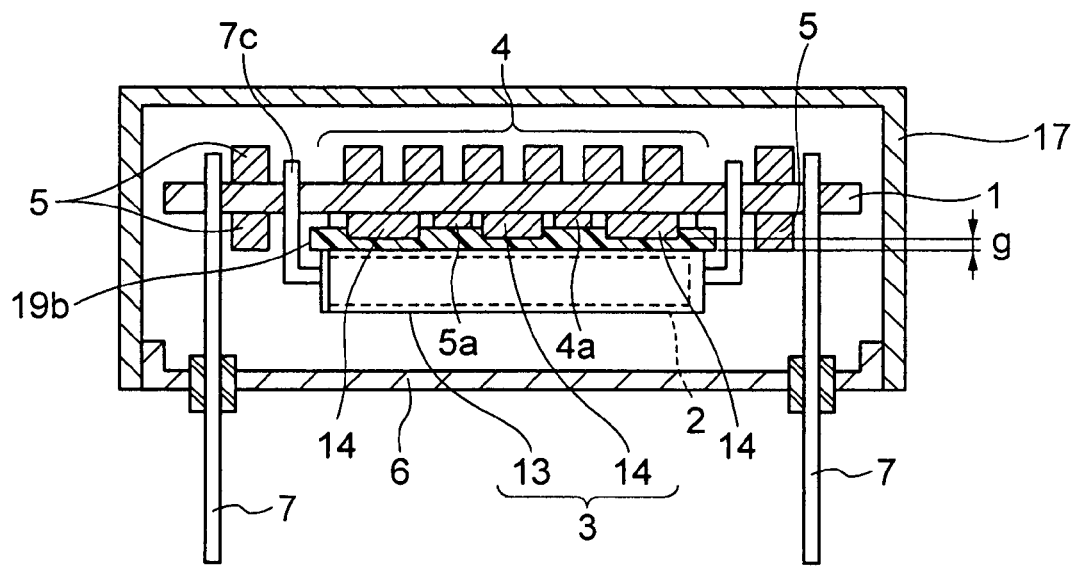
FIG. 2 is a vertical sectional view in the longitudinal direction showing a thermostat mainframe of the highly stable oscillator of the present invention, with one leg not illustrated herein, and showing the thermostat and the like shown in FIG. 1B inverted and arranged in the normal position.

FIG. 1 and FIG. 2 are diagrams for explaining a highly stable oscillator of a first embodiment of the present invention, FIG. 1A being an assembly exploded view of the main points, and FIG. 1B being a sectional view of the main points in the width direction. FIG. 2 is a sectional view in the longitudinal direction showing a thermostat mainframe, with one leg omitted.

As shown in FIG. 1 and FIG. 2, the highly stable oscillator of the first embodiment of the present invention comprises; a crystal resonator 2 with lead wires 8 led out therefrom, a thermostat 3, oscillating elements 4 and temperature control elements 5, and a circuit board 1, with all arranged thereon. Here, the thermostat 3 comprises a thermostat mainframe (metallic cylinder) 13 and heat generating chip resistors 14. The thermostat mainframe 13 supported by a leg 7c with the circuit board 1 has a housing section 15a for the crystal resonator 2, and a cavity 15b as a space on one principal plane having legs 13b extending from widthwise opposite sides of a slab part 13a. The housing section 15a and the cavity 15b are open on the longitudinally opposite sides. The housing section 15a is filled with a resin 19a composed of a thermo-conductive flexible material and thermally bonded to the top region of the crystal resonator 2 (resonator container).

Three of the chip resistors 14, for example, are arranged in parallel in the central region of the one principal plane of the circuit board 1, and electrically connected and adhered to a metallic pattern 16 with holes 18 by soldering. Between the respective chip resistors 14 are arranged, the thermistor 5a as the temperature control element, and the voltage variable capacitative element 4a as the oscillating element. On the chip resistors 14, the thermistor 5a, and the voltage variable capacitative element 4a, is provided, for example, a member 19a composed of a thermo-conductive flexible material combined with an insulating function.

In this first embodiment, for the thermo-conductive flexible material, for example λGEL made by GELTECH Co. Ltd., (registered trademark) in sheet form is laid as a resin 19b. In this case, as shown in FIG. 2, the thickness of the resin 19b is made larger than a gap g between the chip resistors 14 and the bottom of the thermostat mainframe 13. Moreover, the resin 19b in sheet form is interposed between the chip resistors 14, and the resin 19b is pressed by the thermostat mainframe 13. Accordingly, the resin 19b in sheet form can be bitten into by the surroundings of the chip resistor 14, the thermistor 5a and the voltage variable capacitative element 4a, to contact tightly therewith.

Moreover, as shown in FIG. 1B, the thermostat mainframe 13 has the legs 13b in contact with the metallic pattern 16 provided on the circuit board 1 and is fixed to the circuit board 1 by screws inserted through holes 18. The thermistor 5a detects the temperature in the cavity 15b of the thermostat mainframe 13. Moreover, the voltage variable capacitative element 4a makes the oscillation circuit have a variable oscillating frequency of the crystal oscillator, due to the control voltage circuit being a voltage-controlled type. As shown in FIG. 1A, the oscillating elements except for the voltage variable capacitative element 4a are arranged in the central region of the other principal plane of the circuit board 1. The temperature control elements 5 except for the thermistor 5a are arranged on the peripheral region of the other principal plane.

According to such a construction, the chip resistors 14 arranged on the circuit board 1 are directly heat bonded to the thermostat mainframe 13 by the resin 19b in sheet form being the thermo-conductive flexible material, so that the thermostat 3 is formed. In this case, the thermo-conductive flexible material (resin 19b) increases the heat capacity using three chip resistors 14 as one heat source. Moreover, the chip resistors 14 directly supply the heat to the circuit board 1 so that the thermal efficiency is improved and the heat distribution of the circuit board 1 is made uniform. In this embodiment, as shown in FIG. 1B, the legs 13b of the thermostat mainframe 13 are joined to the metallic pattern 16 to which the chip resistors 14 are connected so that the thermal efficiency is further improved. Therefore, frequency fluctuations of the oscillating elements 4 can be prevented by the temperature characteristic being maintained constant.

In particular, since the thermistor 5a and the voltage variable capacitative element 4a being the highly heat sensitive elements are directly heat bonded to the chip resistors 14, the dependency with respect to the exothermic temperature of the chip resistors 14 is high. Therefore, if the thermistor 5a is used, the temperature of the thermostat mainframe 13 can be detected directly (in real time), so that response (followingness) is improved. Moreover, if the voltage variable capacitative element 4a is used, the temperature dependent voltage/capacity characteristic is kept from fluctuating, and the oscillating frequency of the crystal oscillator is stabilized. In particular, since the voltage variable capacitative element 4a is covered by the cavity 15b, there is no effect of convection, and the temperature can be maintained constant compared to the case where they are arranged on the other principal plane of the circuit board 1.

Moreover, since the thermostat 3 uses the chip resistors 14 as the heat source, for example, the coiling operation for the heating coil becomes unnecessary so that manufacturing cost can be reduced. In this first embodiment, the circuit board 1 is composed of one layer, and the oscillating elements 4 and the temperature control element 5 are mounted thereon. Therefore the manufacturing cost can be further decreased. Furthermore, since the circuit board 1 is composed of one layer having an efficient construction, heat radiation is minimal. Moreover since the heat capacity is increased by the thermostat mainframe 13, changes in the oscillating frequency with respect to rapid temperature variations can be prevented. However, in this case, the heat capacity becomes the sum of the thermostat mainframe 13 and the thermo-conductive flexible material (resin 19a and 19b).

Figure 3:
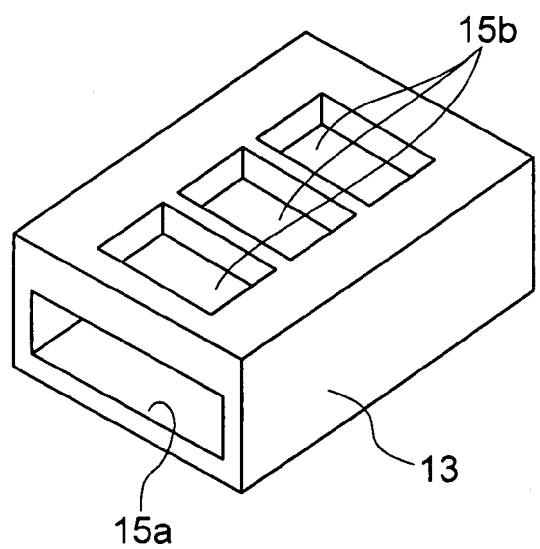
FIG. 3 is a perspective view showing a thermostat mainframe for explaining another example where a plurality of cavities are provided in the thermostat mainframe in the first embodiment of the highly stable oscillator of the present invention.

In the first embodiment, the cavity 15b of the thermostat mainframe 13 has the opposite ends opened, however they may be blocked off surfaces rather than open. In this case, the heat radiation from the opened surfaces can be prevented, giving further efficiency. Furthermore, as shown in FIG. 3, both ends of the thermostat mainframe 13 may be blocked off surfaces and the cavity 15b may be divided into a plurality of cavities 15*b* with the chip resistors 14 and the highly heat sensitive elements arranged into the plurality of cavities 15*b*.

Second Embodiment

Figure 4:
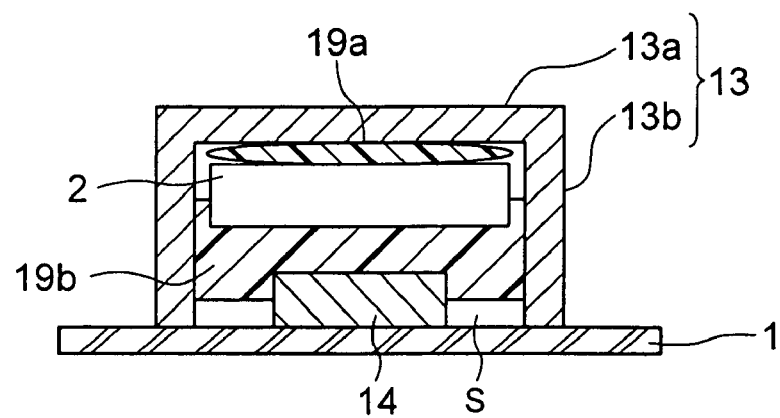
FIG. 4 is a vertical sectional view of the main points of the thermostat in the width direction, for explaining a second embodiment of the highly stable oscillator of the present invention.

FIG. 4 is a vertical sectional view of the main points of a highly stable oscillator, for explaining a second embodiment of the highly stable crystal oscillator of the present invention.

In the second embodiment of the present invention, the thermostat mainframe 13 comprises a pair of legs 13*b* extending from the opposite ends of a slab part 13*a* and forming a space section S in a cross sectional C shape. For example, the thermostat mainframe 13 is formed by folding a metal plate in the C shape.

Moreover, a crystal resonator 2 is arranged in the upper part (slab part 13*a* side) of a space section S and the crystal resonator 2 is adhered and heat bonded to the slab part 13*a* for example by a resin 19*a* being a thermo-conductive flexible material. On a circuit board 1 located at the lower part of the space section S, heat generating chip resistors 14 and a thermistor 5*a* and a voltage variable capacitative element 4*a* being highly heat sensitive elements are arranged. A resin 19*b* in sheet form composed of a thermo-conductive flexible material is adhered and interposed between the crystal resonator 2 and the highly heat sensitive element.

According to such a construction, similarly to the first embodiment, a thermostat 3 which transmits heat from the chip resistors 14 to the crystal resonator 2 by the resin 19*b* composed of the thermo-conductive flexible material, is formed. Therefore, a similar effect to that of the first embodiment of the present invention is demonstrated. Moreover, since the heat capacity of the thermostat mainframe 13 in the C shape is increased, the oscillating frequency can be stably controlled with respect to rapid temperature variations. Furthermore, since the thermostat mainframe 13 may be formed by folding a metal plate in the C shape, the cutting operation becomes unnecessary, and manufacturing cost is reduced.

Figure 5:
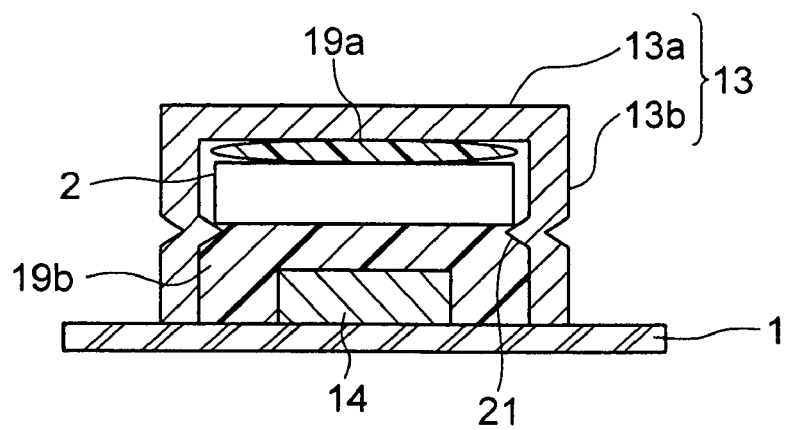
FIG. 5 is a vertical sectional view of the main points of the thermostat in the width direction for explaining another example in the second embodiment of the highly stable oscillator of the present invention.

In this second embodiment, as shown in FIG. 5, when forming the thermostat mainframe 13 by folding the metal plate in the C shape, a pair of projections 21 may be provided so as to reliably hold the crystal resonator 2.

Third Embodiment

Figure 6:
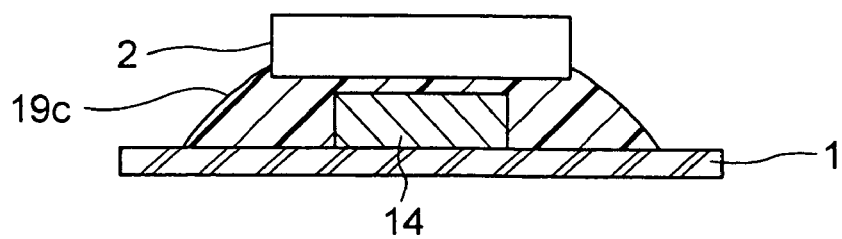
FIG. 6 is a vertical sectional view of the main points of the thermostat in the width direction, for explaining a third embodiment of the highly stable oscillator of the present invention.
Figure 7A:
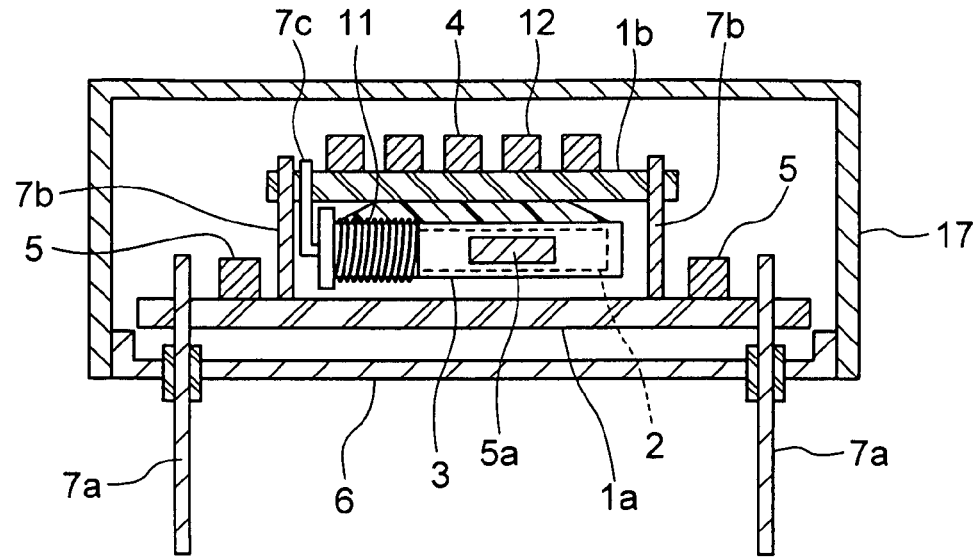
FIG. 7 is diagrams for explaining a conventional highly stable oscillator, FIG. 7A being a fragmentary vertical sectional view of the highly stable oscillator, and FIG. 7B being a conceptual diagram showing a procedure for inserting a crystal resonator into a thermostat.
Figure 7B:
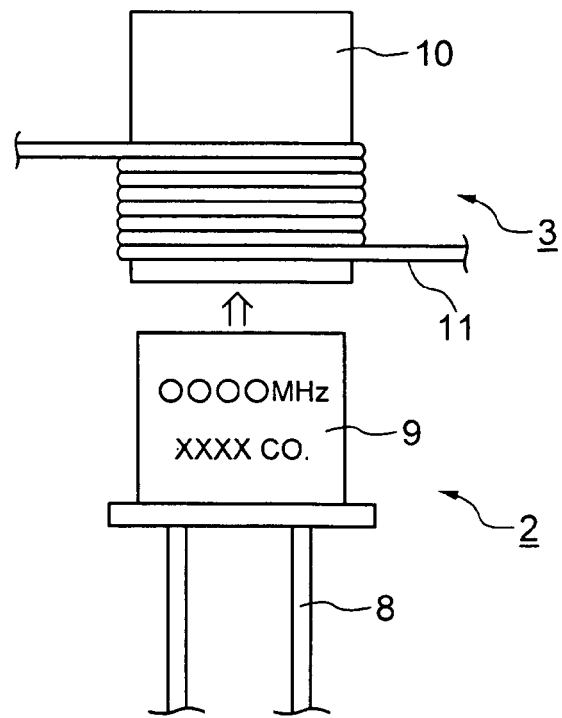

FIG. 6 is a vertical sectional view of the main points of a third embodiment of a highly stable crystal oscillator of the present invention.

In the third embodiment, a thermostat mainframe 13 is constructed as a resonator container of a crystal resonator 2. On a lower face of the resonator container (crystal resonator 2), a heat generating chip resistor 16, a thermistor 5*a* and a voltage variable capacitative element 4*a* serving as highly heat sensitive elements, are arranged. Here, over the chip resistor 14 and the highly heat sensitive element (thermistor 5*a*) mounted on the circuit board 1, is coated a resin 19*c* composed of a thermo-conductive flexible material, and the crystal resonator 2 is superposed thereon, and the resin then cured.

According to such construction, the heat from the chip resistors 14 is transmitted to the crystal resonator 2 by the resin 19*c* serving as the thermo-conductive flexible material, so that the thermostat is formed. Therefore, a similar effect to that of the first and second embodiments is demonstrated.

Moreover, since the aforementioned thermostat mainframe 13 is not used, the cost can be further decreased. In this case, the heat capacity can be controlled according to the amount of the coated thermo-conductive flexible material (resin 19*c*).

In the first to third embodiments described above, the circuit board is made of one layer to decrease manufacturing cost. However, if importance is attached to the functionality of the highly stable oscillator, then similarly to the conventional crystal oscillator, a double layered circuit board may be used. Even if a double layered circuit board is used, the circuit board 1 mounted with the oscillating elements 4 is arranged on the thermostat mainframe 13.

Moreover, the thermistor 5*a* and the voltage variable capacitative element 4*a* are arranged in the cavity 15*b* of the thermostat mainframe 13. However, for example a transistor or the like of the oscillation circuit may also be arranged. The point is that the circuit elements having the high temperature dependency are arranged in the cavity 15*b*. Moreover, one or four or more of the chip resistors may also be arranged as required.

What is claimed is:

1. A crystal oscillator for high stability using a thermostat, comprising; a thermostat mainframe which maintains the temperature of a crystal resonator housed in a resonator container in which is sealed a crystal piece constant, an oscillating element which constitutes an oscillation circuit together with said crystal resonator, a temperature control element which controls the temperature inside of said thermostat mainframe, and a circuit board mounted with said thermostat mainframe, said oscillating element, and said temperature control element, wherein a heat generating chip resistor and a highly heat sensitive element having a higher temperature dependency, among said oscillating element and said temperature control element, are arranged on one principal plane of said circuit board, and said heat generating chip resistor, said highly heat sensitive element, and said thermostat mainframe are directly heat bonded by a thermo-conductive material.

2. A highly stable oscillator according to claim 1, wherein said thermo-conductive material is a flexible material, and said flexible material is arranged between said heat generating chip resistor, said highly heat sensitive element and said thermostat mainframe and adhered thereto.

3. A highly stable oscillator according to claim 2, wherein said flexible material is in sheet form, and said sheet form flexible material is provided between said heat generating chip resistor, said highly heat sensitive element and said thermostat mainframe.

4. A highly stable oscillator according to claim 1, wherein said thermostat mainframe has a space section of a cross sectional C shape with a pair of legs extending from the opposite ends of a housing section, and said crystal resonator is heat bonded to said thermostat mainframe to be arranged in said space section, and said heat generating chip resistor and said highly heat sensitive element are arranged in said space section.

5. A highly stable oscillator according to claim 2, wherein said thermostat mainframe has a space section of a cross sectional C shape with a pair of legs extending from the opposite ends of a housing section, and said crystal resonator is heat bonded to said thermostat mainframe to be arranged in said space section, and said heat generating chip resistor and said highly heat sensitive element are arranged in said space section.

6. A highly stable oscillator according to claim 1, wherein said thermostat mainframe has a space section in a cross sectional C shape with a pair of legs extending from the opposite ends of a slab part, and said crystal resonator is heat bonded to said thermostat mainframe to be arranged in the upper part of said space section, and said heat generating chip resistor and said highly heat sensitive element are arranged at the lower part of said space section.

7. A highly stable oscillator according to claim 2, wherein said thermostat mainframe has a space section in a cross sectional C shape with a pair of legs extending from the opposite ends of a slab part, and said crystal resonator is heat bonded to said thermostat mainframe to be arranged in the upper part of said space section, and said heat generating chip resistor and said highly heat sensitive element are arranged at the lower part of said space section.

8. A highly stable oscillator according to claim 1, wherein said thermostat mainframe constitutes said resonator container, and has said heat generating chip resistor and said highly heat sensitive element arranged on the lower face of said resonator container.

9. A highly stable oscillator according to claim 2, wherein said thermostat mainframe constitutes said resonator container, and has said heat generating chip resistor and said highly heat sensitive element arranged on the lower face of said resonator container.

10. A highly stable oscillator according to claim 1, wherein said highly heat sensitive element is a thermosensor among the temperature control element, or a voltage variable capacitative element among the oscillating element.

11. A highly stable oscillator according to claim 2, wherein said highly heat sensitive element is a thermosensor among the temperature control element, or a voltage variable capacitative element among the oscillating element.

12. A highly stable oscillator according to claim 4, wherein said highly heat sensitive element is a thermosensor among the temperature control element, or a voltage variable capacitative element among the oscillating element.

13. A highly stable oscillator according to claim 5, wherein said highly heat sensitive element is a thermosensor among the temperature control element, or a voltage variable capacitative element among the oscillating element.

14. A highly stable oscillator according to claim 1, wherein said oscillating element is arranged on the other principal plane of said circuit board.

* * * * *